United States Patent
Park (10) Patent No.: US 7,248,077 B2
(45) Date of Patent: Jul. 24, 2007

(54) CURRENT DRIVER CIRCUITS FOR REDUCING SUBSTRATE NOISE AND METHODS OF OPERATING THE SAME

(75) Inventor: Dong-Uk Park, Seoul (KR)

(73) Assignee: Samsung Electronics Co., Ltd, Suwon (KR)

( * ) Notice: Subject to any disclaimer, the term of this patent is extended or adjusted under 35 U.S.C. 154(b) by 106 days.

(21) Appl. No.: 11/186,115

(22) Filed: Jul. 21, 2005

(65) Prior Publication Data

US 2006/0017464 A1    Jan. 26, 2006

(30) Foreign Application Priority Data

Jul. 21, 2004    (KR) .................. 10-2004-0056676

(51) Int. Cl.
*H03K 19/0175* (2006.01)
(52) U.S. Cl. ............................ 326/83; 326/29
(58) Field of Classification Search .............. 326/83, 326/86, 87, 82, 17, 29
See application file for complete search history.

(56) References Cited

U.S. PATENT DOCUMENTS

| | | | | | |
|---|---|---|---|---|---|
| 5,410,189 A | * | 4/1995 | Nguyen | ................. | 327/374 |
| 5,497,113 A | * | 3/1996 | Uber | ................. | 327/170 |
| 6,472,906 B2 | | 10/2002 | Sanwo et al. | ............. | 326/83 |
| 6,597,199 B1 | * | 7/2003 | Bui | ................. | 326/83 |

FOREIGN PATENT DOCUMENTS

| JP | 05-218312 | 8/1993 |
|---|---|---|
| KR | 10-2002-0015159 A | 2/2002 |

* cited by examiner

*Primary Examiner*—James H. Cho
(74) *Attorney, Agent, or Firm*—Myers, Bigel, Sibley & Sajovec, P.A.

(57) ABSTRACT

A current driver circuit includes a pull-down switch unit that is coupled between a node and a first reference potential and is operative to switch between an on-state and an off-state responsive to an input signal. A pull-up switch unit is coupled between the node and a second reference potential and is operative to switch between an on-state and an off-state, complementary to the pull-down switch unit. A turn-on speed of the pull-up switch unit is slower than that of the pull-down switch unit, and a turn-off speed of the pull-up switch unit is faster than that of the pull-down switch unit.

26 Claims, 12 Drawing Sheets

FIG. 1A
(PRIOR ART)

GATE S/W

FIG. 1B
(PRIOR ART)

DRAIN S/W

FIG. 1C
(PRIOR ART)

SOURCE S/W

CURRENT DRIVER CIRCUITS FOR REDUCING SUBSTRATE NOISE AND METHODS OF OPERATING THE SAME

RELATED APPLICATION

This application claims the benefit of and priority to Korean Patent Application No. 2004-56676, filed Jul. 21, 2004 in the Korean Intellectual Property Office (KIPO), the disclosure of which is hereby incorporated by reference.

BACKGROUND OF THE INVENTION

1. Field of the Invention

The present invention relates generally to integrated circuit devices and methods of operating the same and, more particularly, to current driver circuits used in an interface circuit and methods of operating the same.

2. Description of the Related Art

A circuit capable of providing a constant current to an output terminal has been widely used in a charge pump included in a PLL (Phase Locked Loop), a digital-to-analog converter (DAC), a current driving interface and the like. An example of such a circuit will be described below.

Figure 1A:
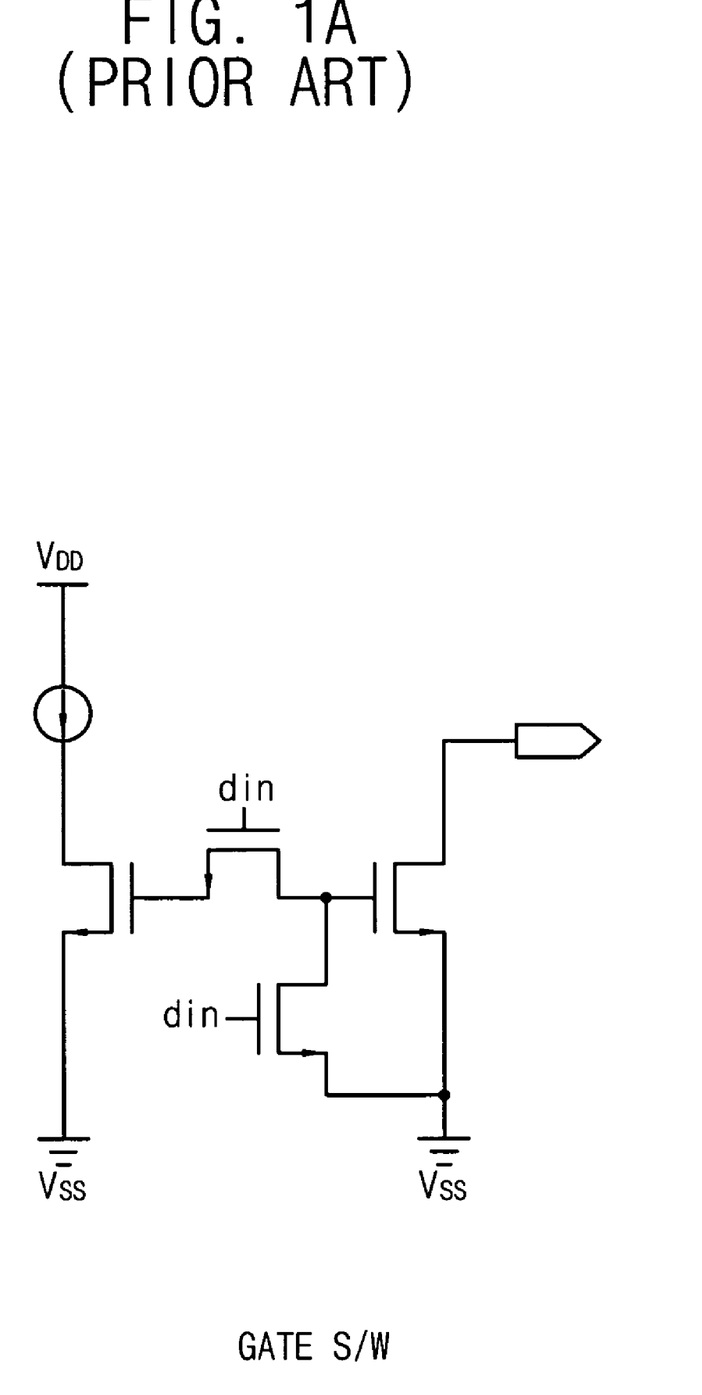
FIGS. 1A, 1B and 1C are circuit diagrams that illustrate conventional open drain drivers according to three switching types.
Figure 1B:
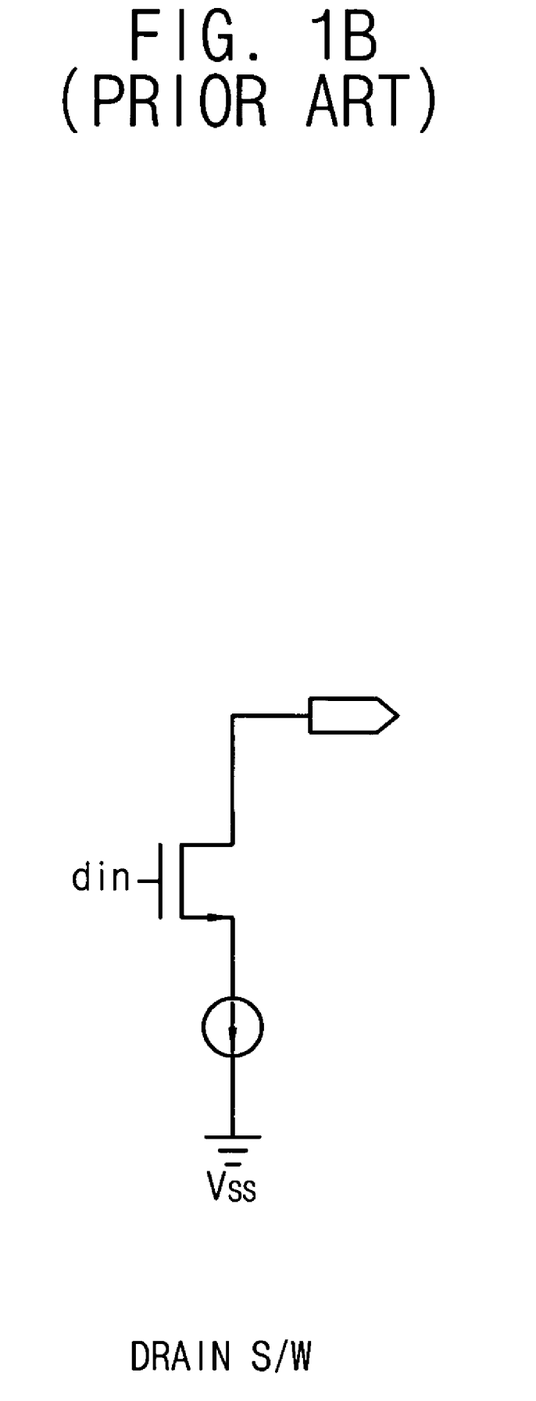
Figure 1C:
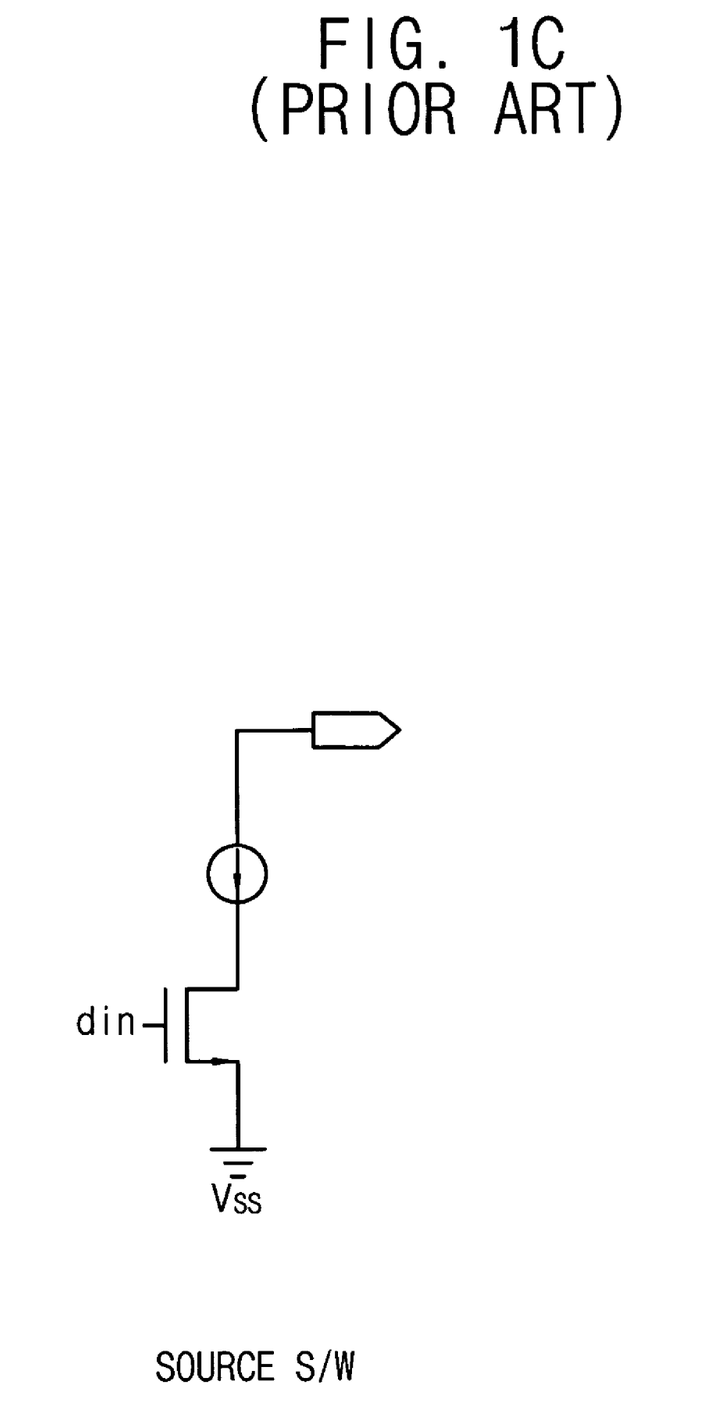

FIGS. 1A, 1B and 1C are circuit diagrams that illustrate conventional open drain drivers according to three switching types.

Referring to FIGS. 1A, 1B and 1C, in a gate switching type (FIG. 1A), variation of a gate-to-source voltage $V_{gs}$ of an output NMOS is large. A drain switching type (FIG. 1B) causes a current spike due to a rapid voltage variation between both terminals of a current source. Thus, a source switching type (FIG. 1C) is usually used as the open drain driver.

Figure 2:
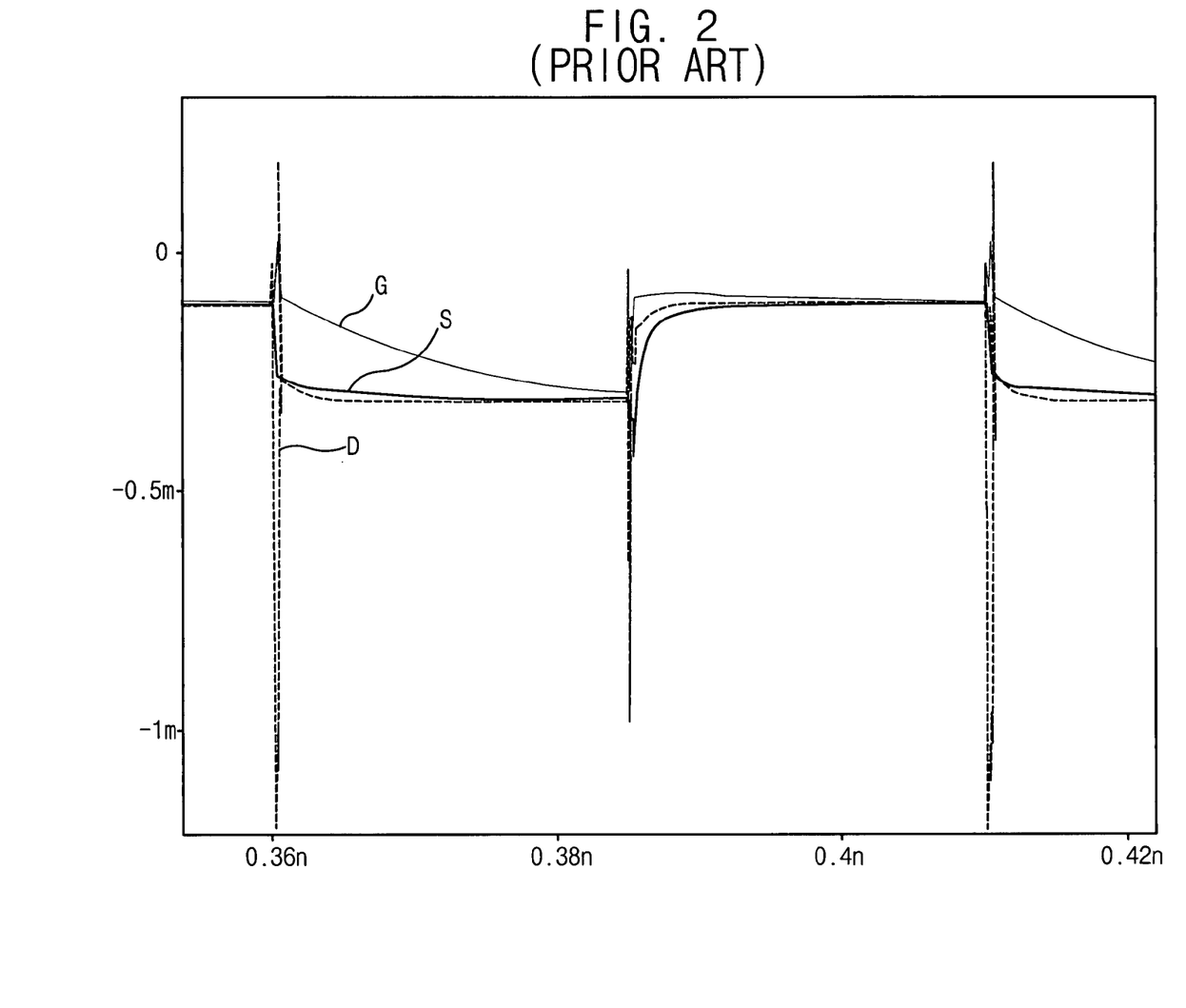
FIG. 2 illustrates simulation waveforms of the conventional open drain drivers according to the three switching types shown in FIGS. 1A, 1B and 1C.

FIG. 2 illustrates simulation waveforms of the conventional open drain drivers according to the three switching types shown in FIGS. 1A, 1B and 1C.

Referring to FIG. 2, in the gate switching type (represented as 'G' in FIG. 2), a current of an output terminal does not follow the variation of an input signal, and the drain switching type (represented as 'D' in FIG. 2) causes a current spike as shown in FIG. 2.

In the source switching type (represented as 'S' in FIG. 2), a current of an output terminal can follow the variation of the input signal and a current spike doesn't occur.

During on and off operations of the source switching type, an output current has a long rising time and a long falling time because a node between a switch and a current source has a relatively low slew rate; therefore, overall system margin may be decreased.

Figure 3A:
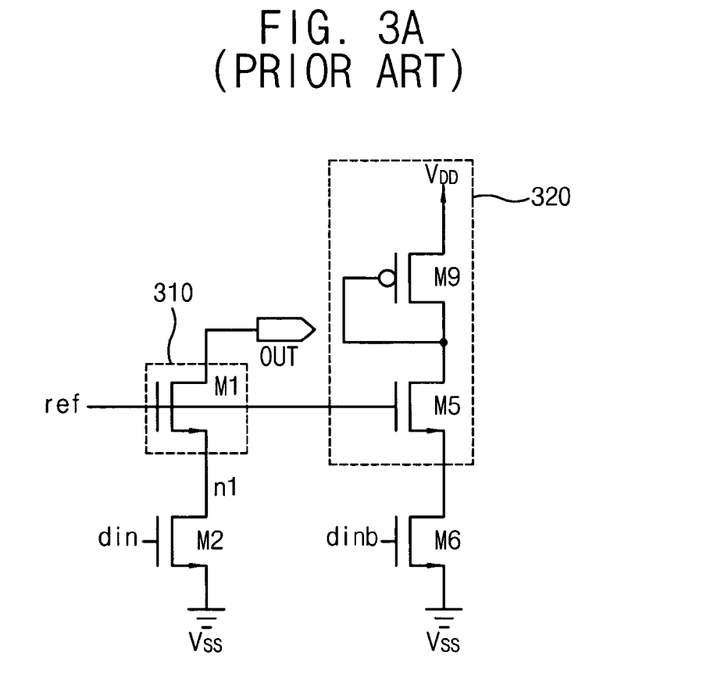
FIG. 3A is a circuit diagram illustrating a conventional first modified open drain driver.

To prevent the decrease of the overall system margin, there are several modifications of the open drain driver using the source switching type shown in FIG. 1. FIG. 3A is a circuit diagram illustrating a conventional first modified open drain driver. Comparing the open drain driver of FIG. 3A with the source switch type open drain driver of FIG. 1C, the open drain driver shown in FIG. 3A may provide a constant current by maintaining a reference potential ref during switching operations while an input signal din having a logic high level and an input signal din having a logic low level are repeatedly applied.

Referring to FIG. 3A, the open drain driver includes a current source 310, a current supply unit 320, a first pull-down transistor M2, and a second pull-down transistor M6. The current source 310 is coupled between an output terminal OUT and a first node n1, and provides a first reference current based on the reference potential ref, and is implemented using an NMOS transistor M1.

The first pull-down transistor M2 is coupled between the first node n1 and a low power voltage Vss, and performs on and off switching operations in response to the input signal din.

The current supply unit 320 includes a diode coupled PMOS transistor M9 and an NMOS transistor M5. The NMOS transistor M5 corresponds to the NMOS transistor M1, and maintains the reference potential ref during switching operations while the input signal din having a logic high level and the input signal din having a logic low level are repeatedly applied.

The second pull-down transistor M6 corresponds to the first pull-down transistor M2, performs switching operations complementary with respect to the switching operation of the first pull-down transistor M2, and allows the NMOS transistor M1 and the NMOS transistor M5 to operate complementarily with each other. Thus, the reference potential ref may be maintained as a current state.

Figure 3B:
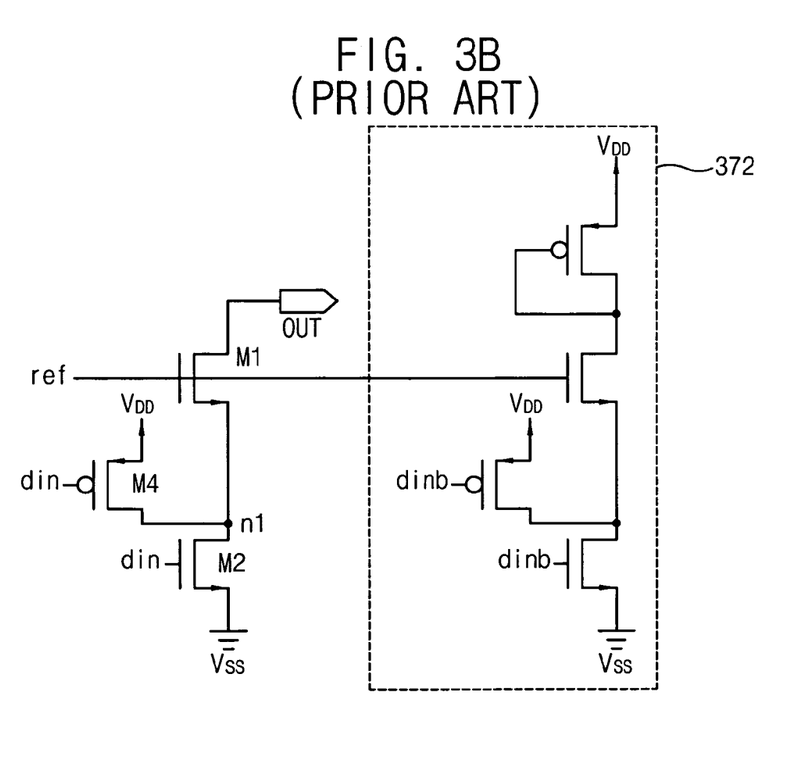
FIG. 3B is a circuit diagram illustrating a conventional second modified open drain driver.

FIG. 3B is a circuit diagram illustrating a conventional second modified open drain driver. The open drain driver shown in FIG. 3B may address the problem of the open drain driver shown in FIG. 3A. The open drain driver shown in FIG. 3A has the problem that a falling time of a current flowing through the output terminal OUT increases because the NMOS transistor M1 has a turn-on state when the input signal din has a low level until a gate-to-source voltage Vgs of the NMOS transistor M1 becomes less than a threshold voltage Vth of the NMOS transistor M1. The open drain driver shown in FIG. 3B includes an additional pull-up PMOS transistor M4 that quickly pulls up an electric charge of the first node n1 when the input signal din has a logic low level. Thus, the NMOS transistor M1 may be quickly turned-off because a voltage of the first node n1 is quickly pulled-up to a high power voltage VDD when the input signal din has a low level.

Similarly with the open drain driver of FIG. 3A, the open drain driver of FIG. 3B uses a circuit 372 that is coupled to the reference potential ref to reduce variation of the reference potential ref due to switching operations of the input signal din.

Figure 3C:
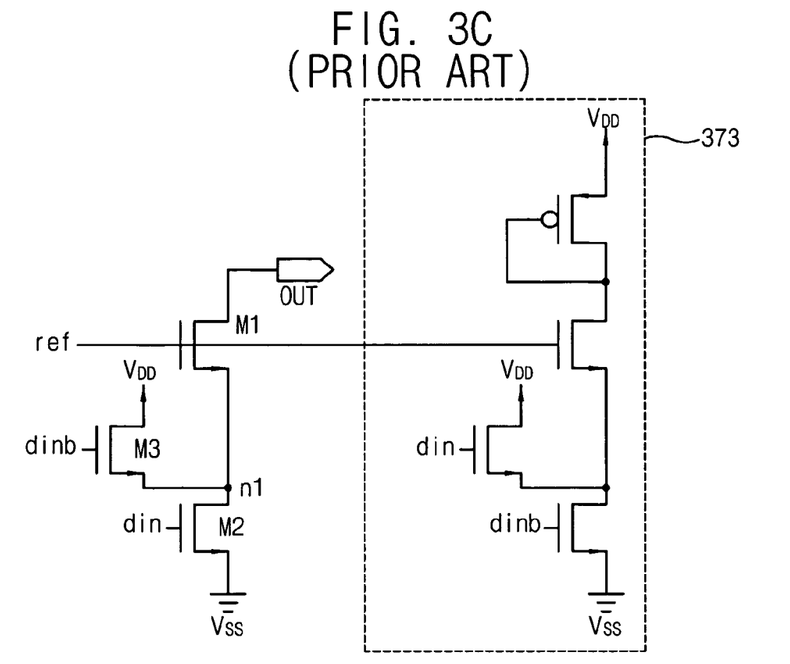
FIG. 3C is a circuit diagram illustrating a conventional third modified open drain driver.

FIG. 3C is a circuit diagram illustrating a conventional third modified open drain driver. The open drain driver shown in FIG. 3C uses an NMOS transistor M3 for a pull-up transistor instead of using a PMOS transistor M4 for a pull-up transistor as shown in FIG. 3B.

A voltage of a first node n1 is not pulled-up to the high power voltage VDD but is pulled-up to a voltage of (VDD−Vth). Vth denotes a threshold voltage of an NMOS transistor M3. As a result, a transition speed of the current flowing through the output terminal OUT may increase when a logic level of an input signal is changed to a low state from a high state. Namely, the slew rate of the current flowing through the output terminal OUT may be increased when the input signal changes to a low level from a high level.

Similarly with the open drain driver of FIG. 3B, the open drain driver of FIG. 3C uses a circuit 373 that is coupled to the reference potential ref to minimize variation of the reference potential ref due to switching operations of the input signal din.

Figure 3D:
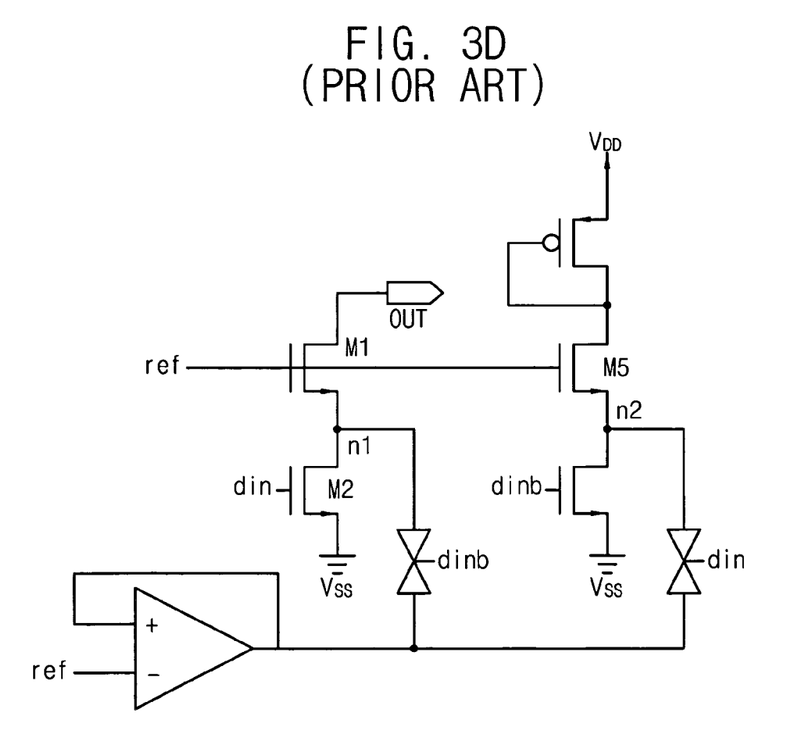
FIG. 3D is a circuit diagram illustrating a conventional fourth modified open drain driver.

FIG. 3D is a circuit diagram illustrating a conventional fourth modified open drain driver. The open drain driver of FIG. 3D uses an operational amplifier to pull up first and second nodes n1, n2 to a reference potential ref, and allows a current source implemented using NMOS transistors M1 and M5 to be quickly turned-off.

The above-described modifications of the open drain driver shown in FIG. 3A through 3D notwithstanding, there remains room for improvement in the art. The open drain driver shown in FIG. 3A has a problem that a falling time of the current at the output terminal OUT is longer, and the open drain driver shown in FIG. 3D includes an operational amplifier so that a relatively large amount of chip area is required, a power consumption increases and a transition speed of the current at the output terminal OUT is relatively low. Namely, the slew rate of the current at the output terminal OUT is relatively low.

The open drain drivers shown in FIGS. 3B and 3C have a problem that a pull-up transistor and a pull-down transistor may be simultaneously turned on. Referring to the open drain driver shown in FIG. 3B, the pull-up transistor M4 implemented using a PMOS transistor has a relatively low mobility compared with that of the NMOS pull-down transistor M2.

Consequently, when a logic state of the input signal din changes to a logic high level from a logic low level, a large amount of current may flow to the ground during the on/off transition because the pull-up transistor M4 isn't turned-off even after the pull-down transistor M2 is turned-on, i.e. the pull-up transistor M4 and the pull-down transistor M2 are simultaneously turned on.

In the open drain driver shown in FIG. 3C, both the pull-up transistor M3 and the pull-down transistor M2 are implemented using an NMOS transistor, however, each of the NMOS transistors M3 and M2 may have a different transition speed from each other. When a transition speed of the pull-up transistor M3 is slower than that of the pull-down transistor M2, the same problem as that of FIG. 3B may occur.

In case that a transition speed of the pull-up transistor M3 is faster than that of the pull-down transistor M2, when a logic state of the input signal din changes to a logic low level from a logic high level, a relatively large amount of current may flow to ground during the on/off transition because the pull-up transistor M3 is turned-off while the pull-down transistor M2 is not yet turned-on, i.e. the pull-up transistor M3 and the pull-down transistor M2 are simultaneously turned on.

As a result, a short current path between the high power voltage VDD and the low power voltage Vss is generated and a current flowing through the short current path brings a substrate noise and power consumption may increase.

SUMMARY OF THE INVENTION

According to some embodiments of the present invention, a current driver circuit includes a pull-down switch unit that is coupled between a node and a first reference potential and is operative to switch between an on-state and an off-state responsive to an input signal; and a pull-up switch unit that is coupled between the node and a second reference potential and is operative to switch between an on-state and an off-state, complementary to the pull-down switch unit, a turn-on speed of the pull-up switch unit being slower than that of the pull-down switch unit, and a turn-off speed of the pull-up switch unit is faster than that of the pull-down switch unit.

In further embodiments of the present invention, a current driver circuit includes a first pull-down switch unit that is coupled between a first node and a first reference potential and is operative to switch between an on-state and an off-state responsive to an input signal; a first pull-up switch unit that is coupled between the first node and a second reference potential and is operative to switch between an on-state and an off-state, complementary to the first pull-down switch unit, a turn-on speed of the first pull-up switch unit being slower than that of the first pull-down switch unit, and a turn-off speed of the first pull-up switch unit being faster than that of the first pull-down switch unit; a second pull-down switch unit that is coupled between a second node and the first reference potential and is operative to switch between an on-state and an off-state responsive to a logical complement of the input signal; a second pull-up switch unit that is coupled between the second node and the second reference potential and is operative to switch between an on-state and an off-state, complementary to the second pull-down switch unit, a turn-on speed of the second pull-up switch unit being slower than that of the second pull-down switch unit, and a turn-off speed of the second pull-up switch unit is faster than that of the second pull-down switch unit; a current source circuit that is coupled between the first node and an output terminal and is responsive to a reference signal; and a current supply circuit that is coupled between the second reference potential and the second node and is responsive to the reference signal.

In further embodiments of the present invention, a method of operating a current driver circuit includes switching a pull-down switch unit between an on-state and an off-state responsive to an input signal; and switching a pull-up switch unit between an on-state and an off-state, complementary to the pull-down switch unit, such that a turn-on speed of the pull-up switch unit is slower than that of the pull-down switch unit, and a turn-off speed of the pull-up switch unit is faster than that of the pull-down switch unit.

In further embodiments of the present invention, a charge pump includes a down current pull-down switch unit that is coupled between a down node and a first reference potential and is operative to switch between an on-state and an off-state responsive to a down input signal; a down current pull-up switch unit that is coupled between the down node and a second reference potential and is operative to switch between an on-state and an off-state, complementary to the down current pull-down switch unit, a turn-on speed of the down current pull-up switch unit being slower than that of the down current pull-down switch unit, and a turn-off speed of the down current pull-up switch unit being faster than that of the down current pull-down switch unit; an up current pull-up switch unit that is coupled between an up node and the second reference potential and is operative to switch between an on-state and an off-state responsive to a logical complement of an up input signal; an up current pull-down switch unit is coupled between the up node and the first reference potential and is operative to switch between an on-state and an off-state, complementary to the up current pull-up switch unit, responsive to the up input signal, a turn-on speed of the up current pull-down switch unit being slower than that of the up current pull-up switch unit, and a turn-off speed of the up current pull-down switch unit being faster than that of the up current pull-up switch unit; a down current source circuit that is coupled between the down node and an output terminal and is responsive to a down reference signal; and an up current source circuit that is coupled between the up node and the output terminal and is responsive to an up reference signal.

BRIEF DESCRIPTION OF THE DRAWINGS

The above and other features and advantages of the present invention will become more apparent by describing in detail example embodiments thereof with reference to the accompanying drawings, in which.

DESCRIPTION OF EMBODIMENTS

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items. Like numbers refer to like elements throughout the description.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top" may be used herein to describe one element's relationship to other elements as illustrated in the figures. It will be understood that relative terms are intended to encompass different orientations of the device in addition to the orientation depicted in the figures. For example, if the device in the figures is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from an implanted to a non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 4:
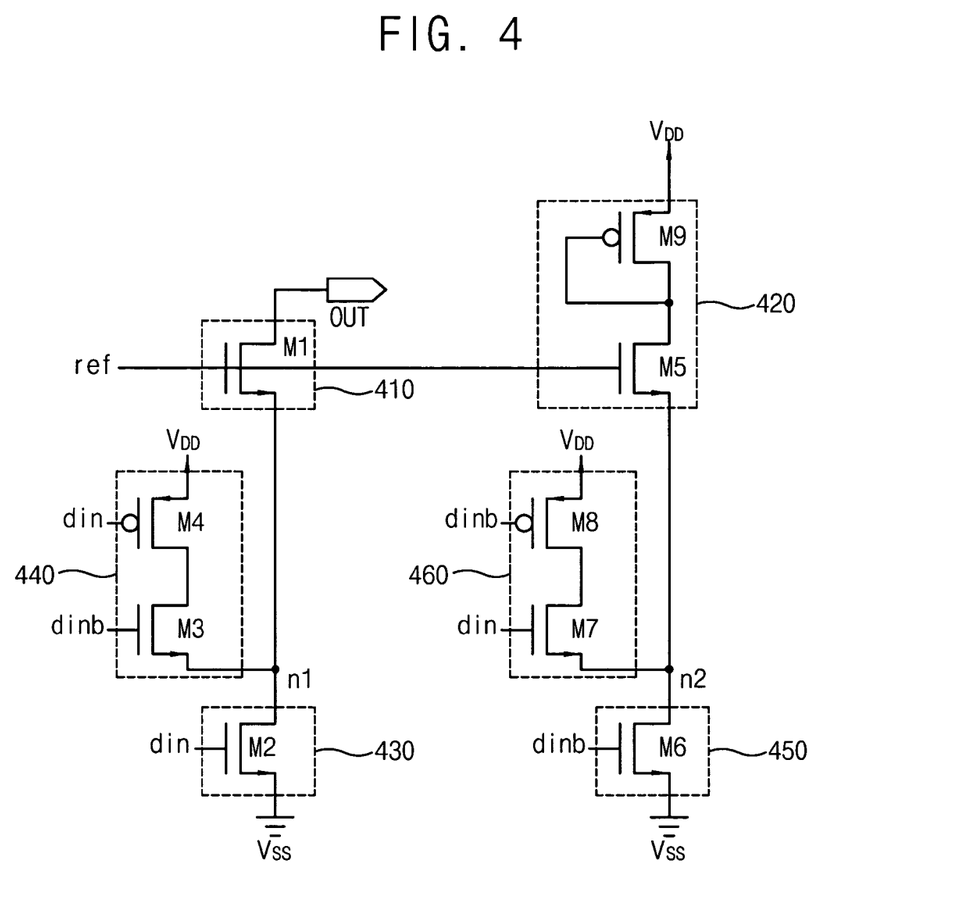
FIG. 4 is a circuit diagram illustrating an open drain driver according to some embodiments of the present invention.

FIG. 4 is a circuit diagram illustrating an open drain driver according to some embodiments of the present invention. Referring to FIG. 4, the open drain driver comprises a current source 410, a current supply unit 420, a first pull-down switch unit 430, a first pull-up switch unit 440, a second pull-down switch unit 450 and a second pull-up switch unit 460.

The current source 410 is implemented using an NMOS transistor M1 similar to that shown in FIGS. 3A through 3B, and provides a first reference current based on a reference potential ref. The first pull-down switch unit 430 is implemented using an NMOS transistor M2 similar to that shown in FIGS. 3A through 3D, is coupled between a first node n1 and the low power voltage Vss, and performs a switching operation in response to an input signal din.

The first pull-up switch unit 440 is coupled between a high power voltage VDD and the first node n1, performs on/off switching operations complementary with respect to the on/off switching operation of the first pull-down switch unit 430; therefore, a turn-on speed of the first pull-up switch unit 440 is slower than that of the first pull-down switch unit 430 and turn-off speed of the first pull-up switch unit 440 is faster than that of the first pull-down switch unit 430.

That is, when the first pull-down switch unit 430 is changed to the off state, the first pull-up switch unit 440 is changed to the on state, and when the first pull-down switch unit 430 is changed to the on state, the first pull-up switch unit 440 is changed to the off state.

Because the turn-on speed of the first pull-up switch unit 440 is slower than that of the first pull-down switch unit 430, and the turn-off speed of the first pull-up switch unit 440 is faster than that of the first pull-down switch unit 430, when the first pull-down switch unit 430 is changed to the off state from the on state, the first pull-up switch unit 440 is changed to the on state from off state more slowly than the first pull-down switch unit 430 is changed to the off state from the on state.

Thus, the first pull-down switch unit 430 and the first pull-up switch unit 440 do not turn on at the same time, and the short current may not flow through the first pull-down switch unit 430 and the first pull-up switch unit 440.

Conversely, when the first pull-down switch unit 430 changes to the on state from the off state, the first pull-up switch unit 440 is changed to the off state from the on state more rapidly than the first pull-down switch unit 430 is changed to the on state from the off state. Thus, the first pull-up switch unit 440 and the first pull-down switch unit 430 are not turned on at the same time, and the short current may not flow through the first pull-down switch unit 430 and the first pull-up switch unit 440.

The first pull-up switch unit 440 includes a PMOS transistor M4 coupled between the high power voltage VDD and the first node n1, and an NMOS transistor M3. A gate of the PMOS transistor M4 receives the input signal din, and a gate of the NMOS transistor M3 receives an inverted input signal dinb. Accordingly, the first pull-up switch unit 440 performs switching operations complementary with respect to the switching operation of the first pull-down switch unit 430.

In detail, when the input signal din is changed to the low state from the high state, the first pull-up switch unit 440 is changed to the on state from the off state, and then the electric potential of the first node n1 is rapidly pulled-up to an electric potential (VDD-Vth). Vth denotes a threshold voltage of the NMOS transistor M2.

When the input signal din is changed to the high state from the low state, the first pull-up switch unit 440 turns off and a current does not flow through the first pull-up switch unit 440.

Due to general PMOS transistor characteristics, an operating speed of the PMOS transistor M4 in the first pull-up switch unit 440 is slower than that of the NMOS transistor M2 in the first pull-down switch unit 430.

The NMOS transistor M3 in the first pull-up switch unit 440 has a smaller size ratio (W/L) than a size ratio (W/L) of the NMOS transistor M2 in the first pull-down switch unit 430 so that the switching speed of the NMOS transistor M3 in the first pull-up switch unit 440 is faster than that of the NMOS transistor M2 in the first pull-down switch unit 430.

Because the PMOS transistor M4, which has an operating speed slower than that of the NMOS transistor M2 in the first pull-down switch unit 430, is serially coupled to the NMOS transistor M3, which has an operating speed faster than that of the NMOS transistor M2 in the first pull-down switch unit 430, a turn-on speed of the first pull-up switch unit 440 is slower than that of the first pull-down switch unit 430, and the turn-off speed of the first pull-up switch unit 440 is faster than that of the first pull-down switch unit 430.

In summary, when the input signal din is changed to the low state from the high state, the NMOS transistor M3 in the first pull-up switch unit 440 is rapidly changed to the on state from the off state; however, the PMOS transistor M4 is slowly changed to the on state from the off state, and, thus, the first pull-up switch unit 440 is slowly changed to the on state from the off state.

Conversely, when the input signal din is changed to the high state from the low state, the PMOS transistor M4 in the first pull-up switch unit 440 is slowly changed to the off state from the on state; however, the NMOS transistor M3 in the first pull-up switch unit 440 is rapidly changed to the off state from the on state, and, thus, the first pull-up switch is rapidly changed to the off state from the on state.

The current supply unit 420 shown in FIG. 4 comprises a PMOS transistor M9 and an NMOS transistor M5 M1 similar to that shown in FIGS. 3A through 3D. The NMOS transistor M5 corresponds to the NMOS transistor M1 implementing the current source 410, and maintains the reference potential ref in a current state regardless of the on/off switching operations of the first pull-down switch unit 430, the first pull-up switch unit 440, the second pull-down switch unit 450, and the second pull-up switch unit 460.

An NMOS transistor M6 of the second pull-down switch unit 450 corresponds to the NMOS transistor M2 of the first pull-down switch unit 430, performs on/off switching operations complementary with respect to the switching operation of the NMOS transistor M2 in the first pull-down switch unit 430, and allows the NMOS transistor M1 and the NMOS transistor M5 to operate complementarily with each other, thus, the reference potential ref may be maintained in a current state. The second pull-up switch unit 460 corresponds to the first pull-up switch unit 440.

Figure 5:
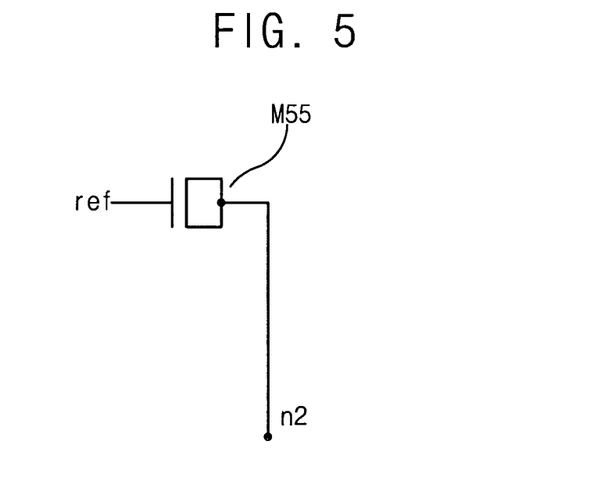
FIG. 5 is a circuit diagram illustrating a current supply unit shown in FIG. 4 according to some embodiments of the present invention.

In other embodiments, the current supply unit 420 may be implemented using a CMOS transistor M55 whose drain and source are coupled to each other as shown in FIG. 5. The CMOS transistor M55 may be implemented using either an NMOS transistor or a PMOS transistor. A gate of the CMOS transistor may be coupled to the second node n2 and the reference potential ref may be applied to a terminal at which the drain and the source are coupled to each other.

Figure 6:
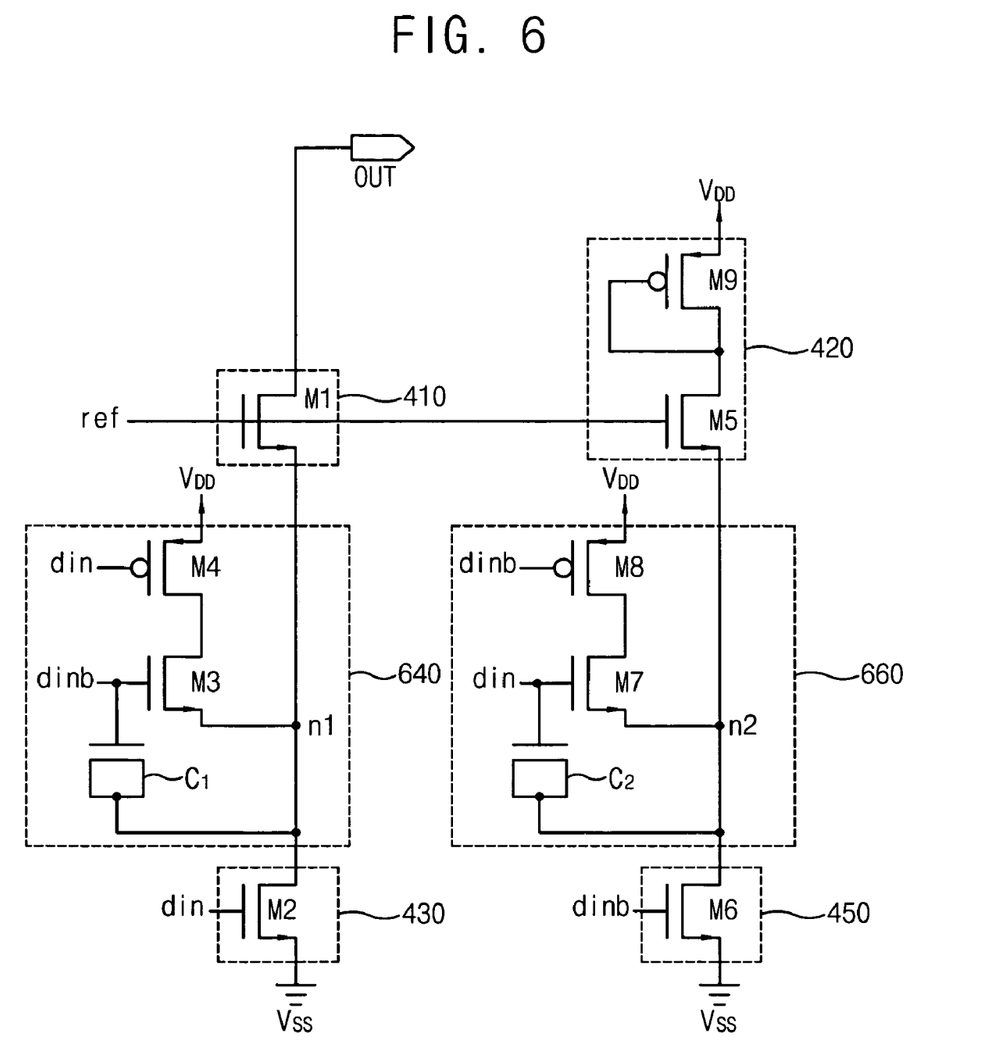
FIG. 6 is a circuit diagram illustrating an open drain driver according to further embodiments of the present invention.

FIG. 6 is a circuit diagram illustrating an open drain driver according to further embodiments of the present invention. Referring to FIG. 6, the open drain driver comprises a first pull-up switch unit 640 having an additional capacitive element, such as a capacitor C1, in comparison with the open drain driver shown in FIG. 4. The capacitor C1 is coupled to an inverted input signal dinb and a first node n1. Further, a second pull-up switch unit 660 of FIG. 6 comprises an additional capacitor C2 that is coupled to an input signal din and a second node n2.

As both of the capacitors C1 and C2 are added to the open drain driver of FIG. 6, when the input signal din is changed to the low state from the high state, an electric potential of the first node n1 is rapidly pulled-up. As a result, an operating speed of the open drain driver shown in FIG. 6 becomes faster than that of the open drain driver shown in FIG. 4. The above stated effect is similarly obtained at the second node n2 when the input signal din is changed to the high state from the low state.

In other embodiments, both of the capacitors C1 and C2 may be implemented using either an NMOS transistor or a PMOS transistor instead of using a CMOS transistor. The source and the drain of the CMOS transistor may be exchanged each other.

Figure 7:
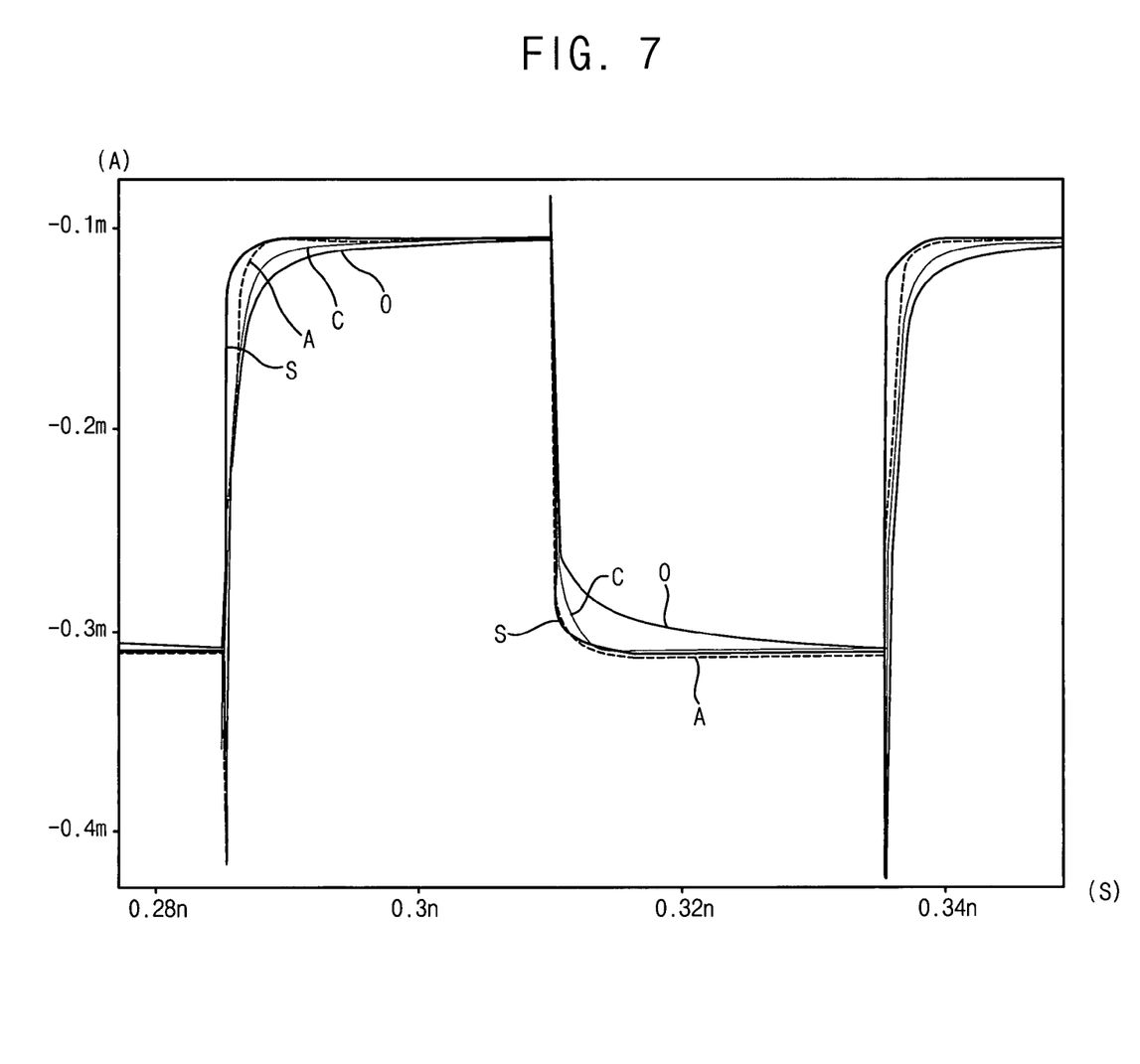
FIG. 7 illustrates simulation waveforms of the open drain driver embodiments shown in FIG. 4 in comparison with a conventional open drain driver.

FIG. 7 illustrates simulation waveforms of the open drain driver shown in FIG. 4 in comparison with a conventional open drain driver. The horizontal axis i.e., x-axis represents time in seconds, and the vertical axis i.e., y-axis represents current in mA. The symbol 'S' indicates a simulation waveform of the open drain driver shown in FIGS. 3B, 3C and 4. The symbol 'A' indicates a simulation waveform of the open drain driver shown in FIG. 3D. The symbol 'C' indicates a simulation waveform of the open drain driver shown in FIG. 3A. The symbol 'O' indicates a simulation waveform of the open drain driver shown in FIG. 1.

Referring to FIG. 7, the performance of the open drain driver shown in FIG. 4, according to some embodiments of the present invention, is substantially equivalent to the performance of the conventional open drain drivers shown in FIGS. 3B and 3D.

Figure 8:
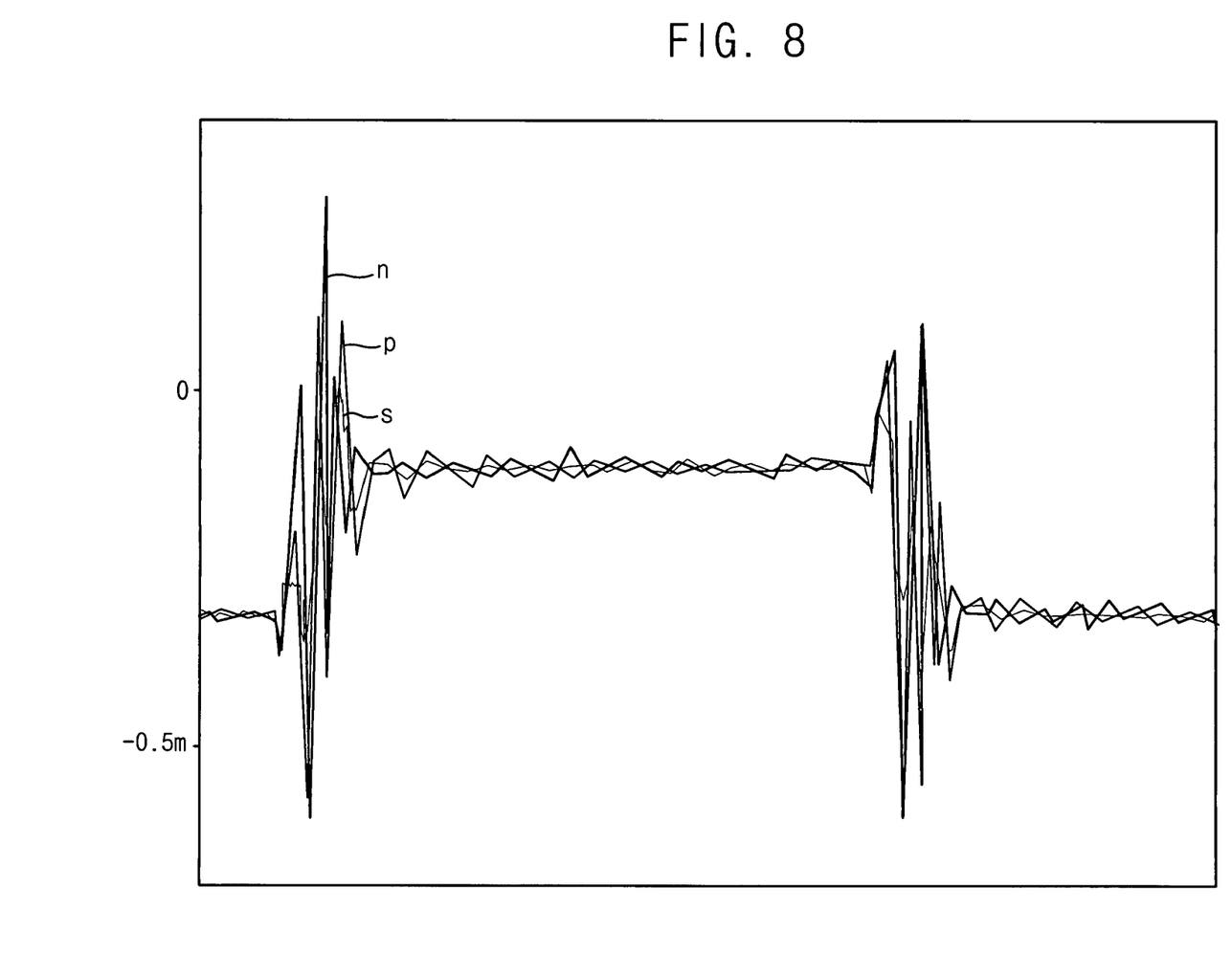
FIG. 8 illustrates simulation waveforms of the open drain driver embodiments shown in FIG. 4 and that of the conventional open drain drivers when a package model is coupled to each of the open drain drivers.

FIG. 8 illustrates simulation waveforms of the open drain driver shown in FIG. 4 and that of the conventional open drain drivers when a package model is coupled to each of the open drain drivers. The symbol 'p' indicates a simulation waveform of the open drain driver shown in FIG. 3B. The symbol 'n' indicates a simulation waveform of the open drain driver shown in FIG. 3C. The symbol 's' indicates a simulation waveform of the open drain driver shown in FIG. 4.

Referring to FIG. 8, the noise of the open drain driver shown in FIG. 4, according to some embodiments of the present invention, is effectively reduced in comparison with that of the conventional open drain drivers shown in FIGS. 3B and 3C.

Figure 9:
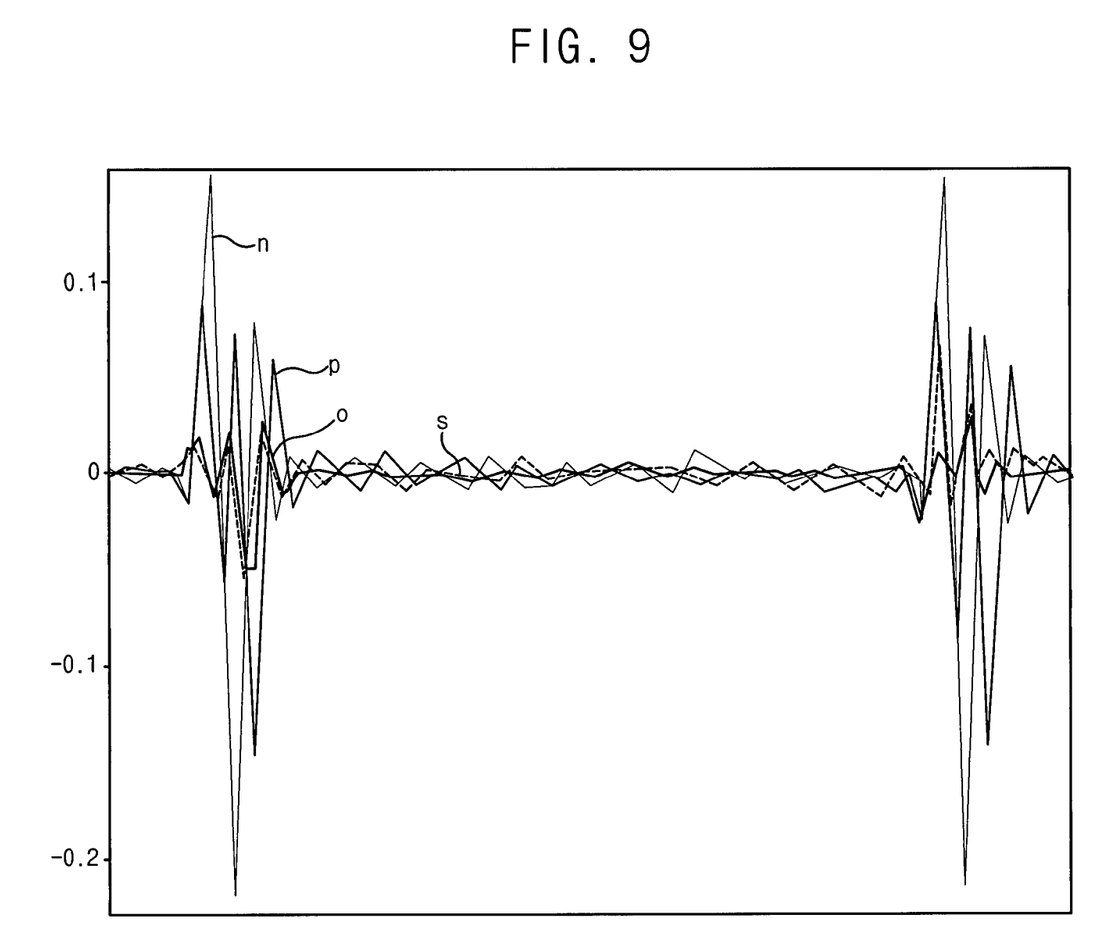
FIG. 9 illustrates a simulation waveform of a current flowing through ground for the embodiments of FIG. 8 in which the package model is coupled to each of the open drain drivers.

FIG. 9 illustrates a simulation waveform of a current flowing through ground for the embodiments of FIG. 8 in which the package model is coupled to each of the open drain drivers. The symbol 'p' indicates a simulation waveform of the open drain driver shown in FIG. 3B. The symbol 'n' indicates a simulation waveform of the open drain driver shown in FIG. 3C. The symbol 's' illustrated in a dotted line indicates a simulation waveform of the open drain driver shown in FIG. 4 according to some embodiments of the present invention. The symbol 'o' indicates a simulation waveform of the conventional open drain driver shown in FIG. 1.

Referring to FIG. 9, a substrate noise of the open drain driver shown in FIG. 4, according to some embodiments of the present invention, is effectively reduced in comparison with that of the conventional open drain driver shown in FIGS. 3B and 3C when a real package model is coupled to an output terminal.

In summary, referring to FIGS. 7 through 9, the open drain driver according to some embodiments of the present invention may prevent the short current path and take advantage that an operating speed, such as a rising time and a falling time, may be faster, the noise of an output current may be reduced, and the power dissipation and the substrate noise may be reduced compared with those of the conventional open drain drivers.

In some embodiments of the open drain driver shown in FIGS. 4 and 6, the current source and the first and second pull-down switch units may be implemented using an NMOS transistor, respectively. The circuits shown in FIGS. 4 and 6, according to some embodiments of the present invention, may be used for an open drain driver; however, the circuits shown in FIGS. 4 and 6 may be applied to any device that requires a current driving circuit. For example, a down switch of a charge pump and a down current source may be implemented using the circuit shown in FIGS. 4 and 6.

Figure 10:
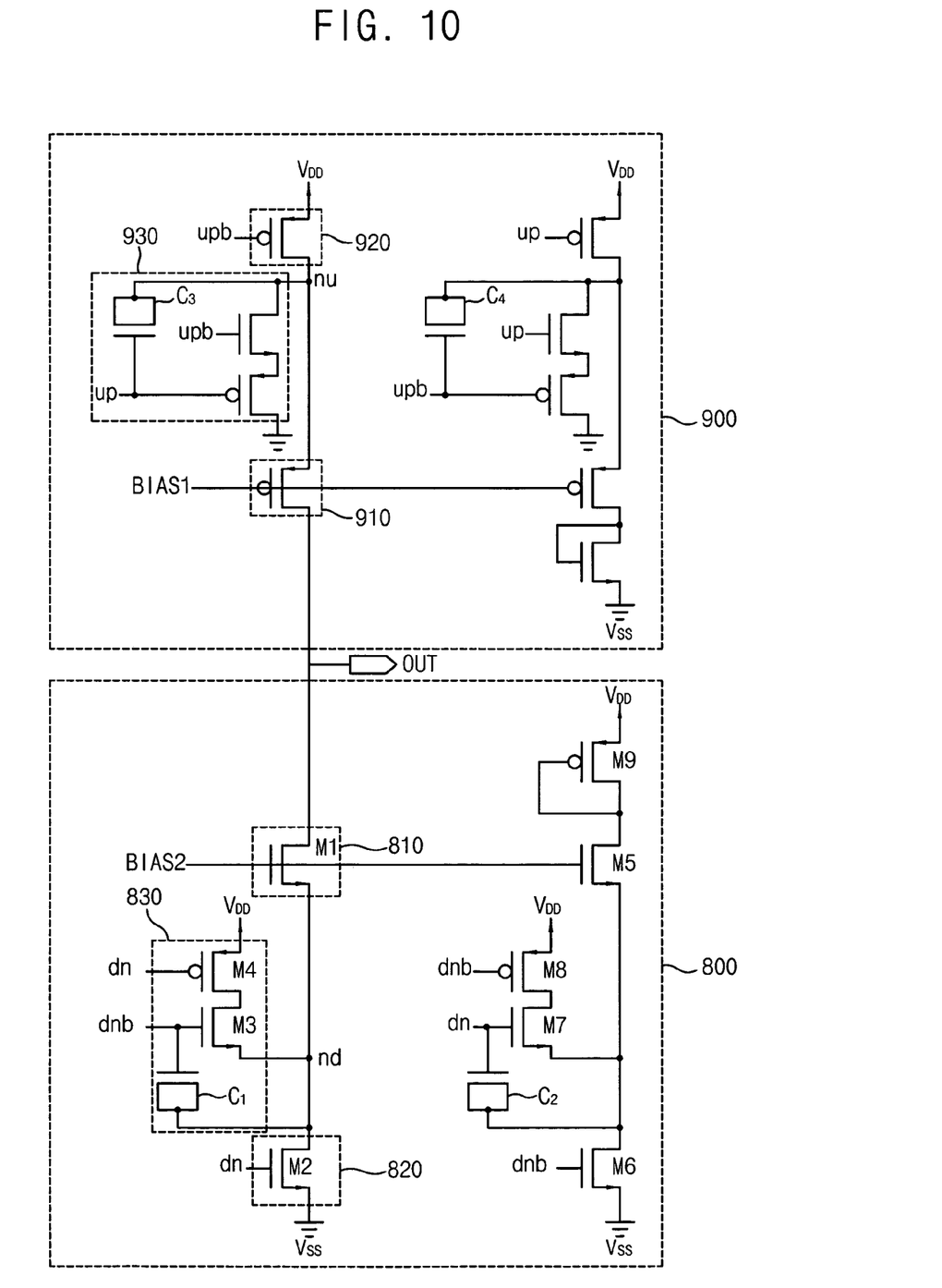
FIG. 10 is a circuit diagram illustrating a charge pump implemented using a current driving circuit according to some embodiments of the present invention.

FIG. 10 is a circuit diagram illustrating a charge pump implemented using a current driving circuit according to some embodiments of the present invention. Referring to FIG. 10, the charge pump comprises a down current driving circuit 800 that allows a down current to flow from an output terminal in response to a down signal, and an up current driving circuit 900 that allows an up current to flow into the output terminal in response to an up signal.

The down current driving circuit 800 has a similar configuration to the open drain driver shown in FIG. 6 except that a second bias voltage BIAS2 is applied instead of the reference potential ref, and the down signal dn is applied instead of the input signal din. The symbol 'dnb' denotes an inverted down signal. The down current driving circuit 800 comprises a down current source 810, a down current pull-down switch unit 820, and a down current pull-up switch unit 830. The down current source 810 is coupled between a down node nd and the output terminal OUT, and provides the down current based on the second bias voltage BIAS2. The down current pull-down switch unit 820, which is coupled between the down node nd and the power voltage Vss, performs switching operations based on the down signal dn and allows the down current to flow through the output terminal OUT only when the down signal is activated.

The down current pull-up switch unit 830 is coupled between a high power voltage VDD and the down node nd, and performs switching operations complementary with respect to the switching operation of the down current pull-down switch unit 820. The turn-on speed of the down current pull-up switch unit 830 is slower than that of the down current pull-down switch unit 820, and the turn-off speed is faster than that of the down current pull-down switch unit 820.

The up current driving circuit 900 is implemented in a symmetrical configuration with respect to the down current driving circuit 800. Particularly, in the up current driving circuit 900, PMOS transistors of the down current driving circuit 800 are substituted with NMOS transistors, and NMOS transistors of the down current driving circuit 800 are substituted with PMOS transistors. Operations of the up current driving circuit 900 may be understood from the operation of the down current driving circuit 800.

The up current driving circuit 900 comprises an up current source 910, an up current pull-up switch unit 920 and an up current pull-down switch unit 930. The up current source 910 is coupled between an up node nu and the output terminal OUT, and provides the up current based on a first bias voltage BIAS1. The up current pull-up switch unit 920 is coupled between the up node nu and the high power voltage VDD, performs switching operations in response to an inverted up signal upb, and allows the up current to flow to the output terminal OUT only when the up signal up is activated.

The up current pull-down switch unit 930 is coupled between the power voltage Vss and the up node nu, and performs switching operations complementary with respect to the switching operation of the up current pull-up switch unit 920. The turn-on speed of the up current pull-down switch unit 930 is slower than that of the up current pull-up switch unit 920, and the turn-on speed of the up current pull-down switch unit 930 is faster than that of the up current pull-up switch unit 920.

As described above, the charge pump incorporating the current driving circuit, according to some embodiments of the present invention, may be capable of reducing substrate noise. The open drain driver and the current driving method, according to some embodiments of the present invention, may reduce short current and may reduce the noise of the output current and the substrate noise, thus, power dissipation also may be reduced by reducing the short current.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

The invention claimed is:

1. A current driver circuit, comprising:
  a pull-down switch unit that is coupled between a node and a first reference potential and is operative to switch between an on-state and an off-state responsive to an input signal;
  a pull-up switch unit that is coupled between the node and a second reference potential and is operative to switch between an on-state and an off-state, complementary to the pull-down switch unit, a turn-on speed of the pull-up switch unit being slower than that of the pull-down switch unit, and a turn-off speed of the pull-up switch unit being faster than that of the pull-down switch unit; and
  a current source circuit that is coupled between the node and an output terminal.

2. A current driver circuit, comprising:
  a pull-down switch unit that is coupled between a node and a first reference potential and is operative to switch between an on-state and an off-state responsive to an input signal; and
  a pull-up switch unit that is coupled between the node and a second reference potential and is operative to switch between an on-state and an off-state, complementary to the pull-down switch unit, a turn-on speed of the pull-up switch unit being slower than that of the pull-down switch unit, and a turn-off speed of the pull-up switch unit being faster than that of the pull-down switch unit;
  wherein the pull-up switch unit comprises a PMOS transistor and an NMOS transistor coupled in series between the node and the second reference potential.

3. The current driver circuit of claim 2, wherein a gate of the PMOS transistor receives the input signal and a gate of the NMOS transistor receives a logical complement of the input signal.

4. The current driver circuit of claim 3, further comprising:
  a capacitive element coupled between the gate of the NMOS transistor and the node.

5. The current driver circuit of claim 4, wherein the capacitive element comprises a CMOS transistor whose drain and source are coupled together.

6. The current driver circuit of claim 2, wherein a switching speed of the PMOS transistor is slower than that of the pull-down switch unit and a switching speed of the NMOS transistor is faster than that of the pull-down switch unit.

7. The current driver circuit of claim 6, wherein the NMOS transistor is a first NMOS transistor, the pull-down switch unit comprises a second NMOS transistor, and a size ratio (width/length) of the first NMOS transistor is smaller than that of the second NMOS transistor.

8. The current driver circuit of claim 2, wherein the second reference potential is greater than the first reference potential.

9. A current driver circuit, comprising:
  a first pull-down switch unit that is coupled between a first node and a first reference potential and is operative to switch between an on-state and an off-state responsive to an input signal;
  a first pull-up switch unit that is coupled between the first node and a second reference potential and is operative to switch between an on-state and an off-state, complementary to the first pull-down switch unit, a turn-on speed of the first pull-up switch unit being slower than that of the first pull-down switch unit, and a turn-off speed of the first pull-up switch unit being faster than that of the first pull-down switch unit;
  a second pull-down switch unit that is coupled between a second node and the first reference potential and is operative to switch between an on-state and an off-state responsive to a logical complement of the input signal;
  a second pull-up switch unit that is coupled between the second node and the second reference potential and is operative to switch between an on-state and an off-state, complementary to the second pull-down switch unit, a turn-on speed of the second pull-up switch unit being slower than that of the second pull-down switch unit, and a turn-off speed of the second pull-up switch unit being faster than that of the second pull-down switch unit;
  a current source circuit that is coupled between the first node and an output terminal and is responsive to a reference signal; and
  a current supply circuit that is coupled between the second reference potential and the second node and is responsive to the reference signal.

10. The current driver circuit of claim 9, wherein the first pull-up switch unit comprises a first PMOS transistor and a first NMOS transistor coupled in series between the first node and the second reference potential and the second pull-up switch unit comprises a second PMOS transistor and a second NMOS transistor coupled in series between the second node and the second reference potential.

11. The current driver circuit of claim 10, wherein a gate of the first PMOS transistor and a gate of the second NMOS transistor receives the input signal and a gate of the first NMOS transistor and a gate of the second PMOS transistor receives a logical complement of the input signal.

12. The current driver circuit of claim 11, further comprising:
  a first capacitive element coupled between the gate of the first NMOS transistor and the first node; and
  a second capacitive element coupled between the gate of the second NMOS transistor and the second node.

13. The current driver circuit of claim 12, wherein the first and second capacitive elements comprise a first and a second CMOS transistors whose drain and source are coupled together, respectively.

14. The current driver circuit of claim 10, wherein a switching speed of the first PMOS transistor is slower than that of the first pull-down switch unit and a switching speed of the first NMOS transistor is faster than that of the first pull-down switch unit, and wherein a switching speed of the second PMOS transistor is slower than that of the second pull-down switch unit and a switching speed of the second NMOS transistor is faster than that of the second pull-down switch unit.

15. The current driver circuit of claim 14, wherein the first pull-down switch unit comprises a third NMOS transistor and a size ratio (width/length) of the first NMOS transistor is smaller than that of the third NMOS transistor, and wherein the second pull-down switch unit comprises a fourth NMOS transistor and a size ratio (width/length) of the second NMOS transistor is smaller than that of the fourth NMOS transistor.

16. The current driver circuit of claim 9, wherein the second reference potential is greater than the first reference potential.

17. A method of operating a current driver circuit, comprising:
   switching a pull-down switch unit between an on-state and an off-state responsive to an input signal; and
   switching a pull-up switch unit between an on-state and an off-state, complementary to the pull-down switch unit, such that a turn-on speed of the pull-up switch unit is slower than that of the pull-down switch unit, and a turn-off speed of the pull-up switch unit being is faster than that of the pull-down switch unit;
   wherein the pull-up switch unit comprises a PMOS transistor and an NMOS transistor coupled in series.

18. The method of claim 17, wherein a switching speed of the PMOS transistor is slower than that of the pull-down switch unit and a switching speed of the NMOS transistor is faster than that of the pull-down switch unit.

19. A charge pump, comprising:
   a down current pull-down switch unit that is coupled between a down node and a first reference potential and is operative to switch between an on-state and an off-state responsive to a down input signal;
   a down current pull-up switch unit that is coupled between the down node and a second reference potential and is operative to switch between an on-state and an off-state, complementary to the down current pull-down switch unit, responsive to the down input signal, a turn-on speed of the down current pull-up switch unit being slower than that of the down current pull-down switch unit, and a turn-off speed of the down current pull-up switch unit being faster than that of the down current pull-down switch unit;
   an up current pull-up switch unit that is coupled between an up node and the first reference potential and is operative to switch between an on-state and an off-state responsive to a logical complement of an up input signal;
   an up current pull-down switch unit that is coupled between the up node and the second reference potential and is operative to switch between an on-state and an off-state, complementary to the up current pull-up switch unit, responsive to the up input signal, a turn-on speed of the up current pull-down switch unit being slower than that of the up current pull-up switch unit, and a turn-off speed of the up current pull-down switch unit being faster than that of the up current pull-up switch unit;
   a down current source circuit that is coupled between the down node and an output terminal and is responsive to a down reference signal; and
   an up current source circuit that is coupled between the up node and the output terminal and is responsive to an up reference signal.

20. The charge pump of claim 19, wherein the down current pull-up switch unit comprises a first PMOS transistor and a first NMOS transistor coupled in series between the down node and the second reference potential and the up current pull-down switch unit comprises a second PMOS transistor and a second NMOS transistor coupled in series between the up node and the first reference potential.

21. The charge pump of claim 20, wherein a gate of the first PMOS transistor receives the down input signal and a gate of the second PMOS transistor receives the up input signal.

22. The charge pump of claim 21, further comprising:
   a first capacitive element coupled between the gate of the first NMOS transistor and the down node; and
   a second capacitive element coupled between the gate of the second PMOS transistor and the up node.

23. The charge pump of claim 22, wherein the first and second capacitive elements comprise a first and a second CMOS transistors whose drain and source are coupled together, respectively.

24. The charge pump of claim 20, wherein a switching speed of the first PMOS transistor is slower than that of the down current pull-down switch unit and a switching speed of the first NMOS transistor is faster than that of the down current pull-down switch unit, and wherein a switching speed of the second PMOS transistor is slower than that of the up current pull-up switch unit and a switching speed of the second NMOS transistor is faster than that of the up current pull-up switch unit.

25. The charge pump of claim 24, wherein the down current pull-down switch unit comprises a third NMOS transistor and a size ratio (width/length) of the first NMOS transistor is smaller than that of the third NMOS transistor, and wherein the up current pull-up switch unit comprises a third PMOS transistor and a size ratio (width/length) of the second PMOS transistor is smaller than that of the third PMOS transistor.

26. The charge pump of claim 19, wherein the second reference potential is greater than the first reference potential.

* * * * *